United States Patent
Kim et al.

(10) Patent No.: US 11,158,581 B2
(45) Date of Patent: Oct. 26, 2021

(54) SEMICONDUCTOR PACKAGE HAVING SEMICONDUCTOR CHIP BETWEEN FIRST AND SECOND REDISTRIBUTION LAYERS

(71) Applicant: SAMSUNG ELECTRONICS CO., LTD., Suwon-si (KR)

(72) Inventors: Joonsung Kim, Suwon-si (KR); Doohwan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 31 days.

(21) Appl. No.: 16/679,484

(22) Filed: Nov. 11, 2019

(65) Prior Publication Data

US 2020/0161203 A1 May 21, 2020

(30) Foreign Application Priority Data

Nov. 19, 2018 (KR) .......................... 10-2018-0142583

(51) Int. Cl.
*H01L 23/538* (2006.01)
*H01L 23/498* (2006.01)
*H01L 23/31* (2006.01)
*H01L 23/13* (2006.01)

(52) U.S. Cl.
CPC .......... *H01L 23/5389* (2013.01); *H01L 23/13* (2013.01); *H01L 23/3128* (2013.01); *H01L 23/49816* (2013.01); *H01L 23/49822* (2013.01); *H01L 23/49827* (2013.01); *H01L 23/49838* (2013.01)

(58) Field of Classification Search
CPC ................. H01L 23/3128; H01L 23/13; H01L 23/49838; H01L 23/49827; H01L 23/49822; H01L 23/5389; H01L 23/49816
See application file for complete search history.

(56) References Cited

U.S. PATENT DOCUMENTS

| 2012/0119373 | A1 | 5/2012 | Hunt |
| 2013/0307140 | A1 | 11/2013 | Huang et al. |
| 2016/0260684 | A1* | 9/2016 | Zhai .................... H01L 25/0652 |
| 2018/0076178 | A1* | 3/2018 | Park ..................... H01L 23/3157 |
| 2018/0082933 | A1* | 3/2018 | Ko ........................... H01L 23/16 |

(Continued)

FOREIGN PATENT DOCUMENTS

KR 10-2013-0129058 A 11/2013

*Primary Examiner* — Michael Jung
(74) *Attorney, Agent, or Firm* — Sughrue Mion, PLLC

(57) ABSTRACT

A semiconductor package may include: a frame having a cavity and including a wiring structure connecting first and second surfaces of the frame to each other; a first connection structure d on the second surface of the frame and including a first redistribution layer connected to the wiring structure; a semiconductor chip on the first connection structure within the cavity and having connection pads connected to the first redistribution layer; an encapsulant encapsulating the semiconductor chip, covering the first surface of the frame, and having an upper surface substantially coplanar with an upper surface of the wiring structure; and a second connection structure including an insulating layer disposed on the upper surfaces of the encapsulant and the wiring structure, a second redistribution layer on the insulating layer, and vias penetrating through the insulating layer and connecting the wiring structure and the second redistribution layer.

16 Claims, 13 Drawing Sheets

(56) References Cited

U.S. PATENT DOCUMENTS

2018/0096968 A1* 4/2018 Lee .................. H01L 24/19
2019/0096829 A1* 3/2019 Tang ................ H01L 21/568
2020/0211962 A1* 7/2020 Tsai ................. H01L 21/6835

* cited by examiner

I-I'

A

SEMICONDUCTOR PACKAGE HAVING SEMICONDUCTOR CHIP BETWEEN FIRST AND SECOND REDISTRIBUTION LAYERS

CROSS-REFERENCE TO RELATED APPLICATION(S)

This application claims benefit of priority to Korean Patent Application No. 10-2018-0142583 filed on Nov. 19, 2018 in the Korean Intellectual Property Office, the disclosure of which is incorporated herein by reference in its entirety.

TECHNICAL FIELD

The present disclosure relates to a semiconductor package.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded. One type of package technology suggested to satisfy the technical demand as described above may be a fan-out semiconductor package. Such a fan-out semiconductor package has a compact size and may allow a plurality of pins to be implemented by redistributing connection pads also in a region that is out of a semiconductor chip.

SUMMARY

An aspect of the present disclosure may provide a semiconductor package in which a fine backside redistribution layer may be stably formed.

According to an aspect of the present disclosure, a semiconductor package may include: a frame having a cavity and including a wiring structure connecting first and second surfaces of the frame to each other, the first and second surface opposing each other; a first connection structure disposed on the second surface of the frame and including a first redistribution layer connected to the wiring structure; a semiconductor chip disposed on the first connection structure within the cavity and having connection pads connected to the first redistribution layer; an encapsulant encapsulating the semiconductor chip, covering the first surface of the frame, and having an upper surface substantially coplanar with an upper surface of the wiring structure; and a second connection structure including an insulating layer disposed on the upper surfaces of the encapsulant and the wiring structure coplanar with each other, a second redistribution layer disposed on the insulating layer, and vias penetrating through the insulating layer and connecting the wiring structure and the second redistribution layer to each other.

According to another aspect of the present disclosure, a semiconductor package may include: a frame having a cavity and including a wiring structure connecting first and second surfaces of the frame to each other, the first and second surface opposing each other; a first connection structure disposed on the second surface of the frame and including a first redistribution layer connected to the wiring structure; a semiconductor chip disposed on the first connection structure within the cavity and having connection pads connected to the first redistribution layer; an encapsulant encapsulating the semiconductor chip, covering the first surface of the frame, and formed of a non-photoimagable dielectric (PID); and a second connection structure including an insulating layer disposed on upper surfaces of the encapsulant and the wiring structure and formed of a PID, a second redistribution layer disposed on the insulating layer, and vias penetrating through the insulating layer and connecting the wiring structure and the second redistribution layer to each other. The encapsulant may have the upper surface substantially coplanar with the upper surface of the wiring structure.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above, and concepts of upper and lower portions may be exchanged with each other.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
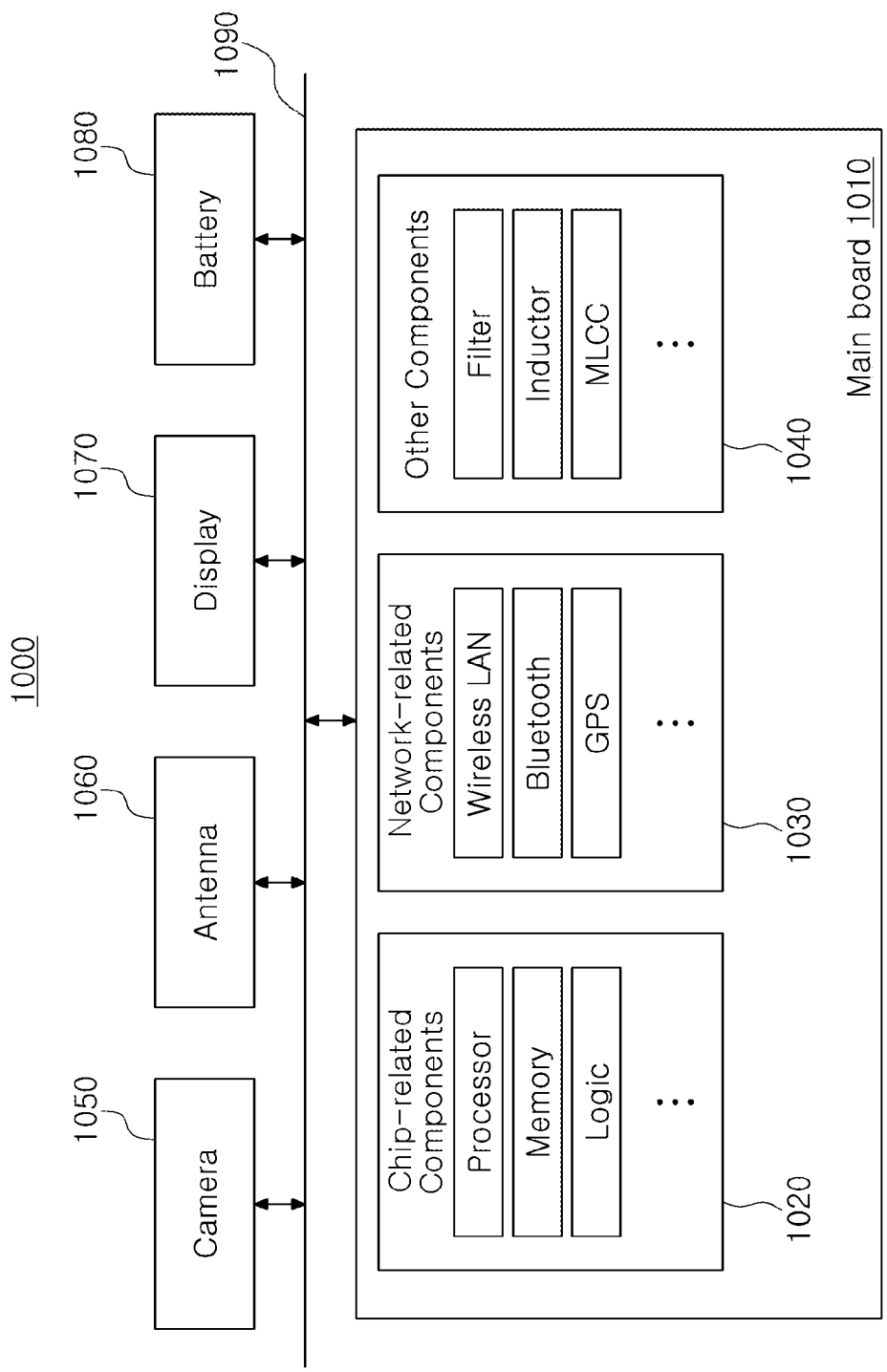
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
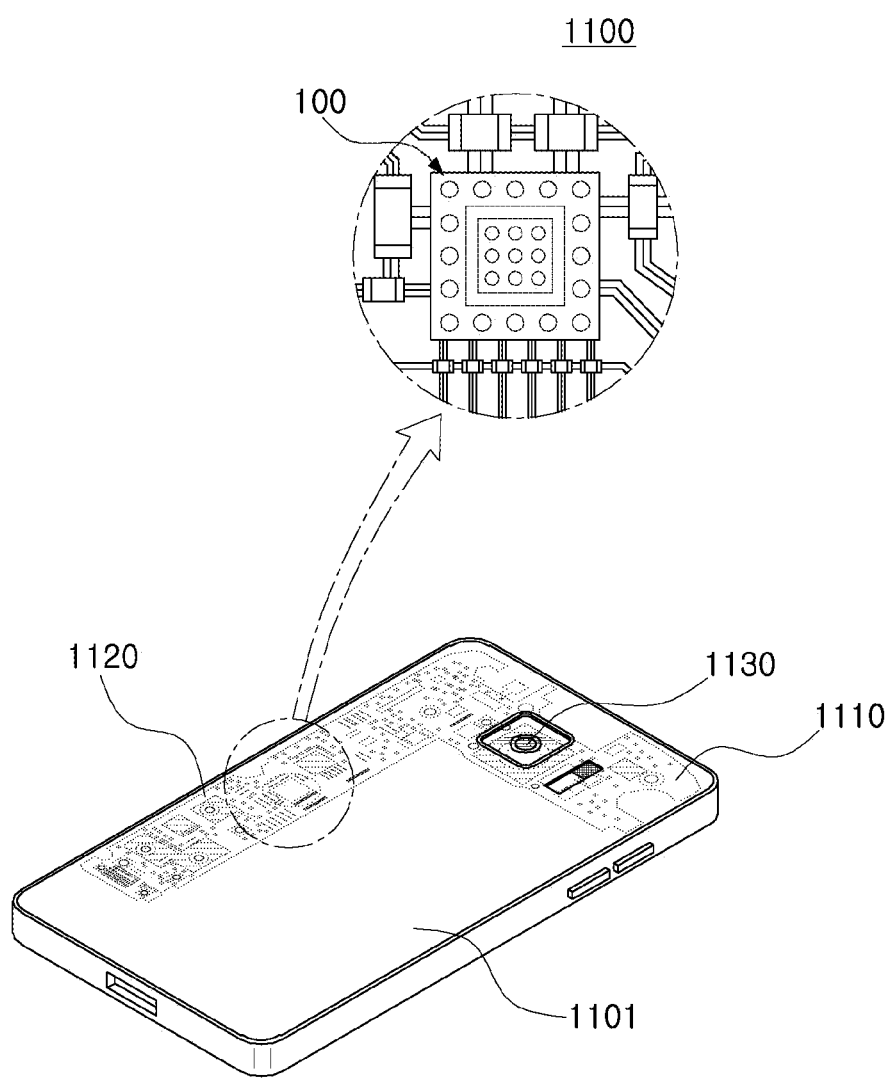
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the accompanying drawings.

Fan-in Semiconductor Package

Figure 3B:
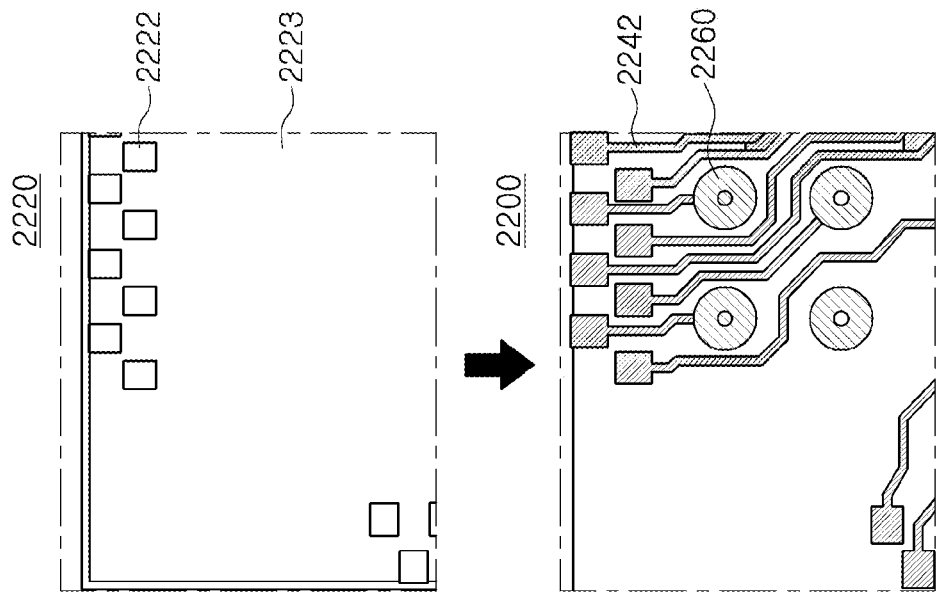
FIGS. 3A and 3B are schematic cross-sectional views illustrating states of a fan-in semiconductor package before and after being packaged.
Figure 3A:
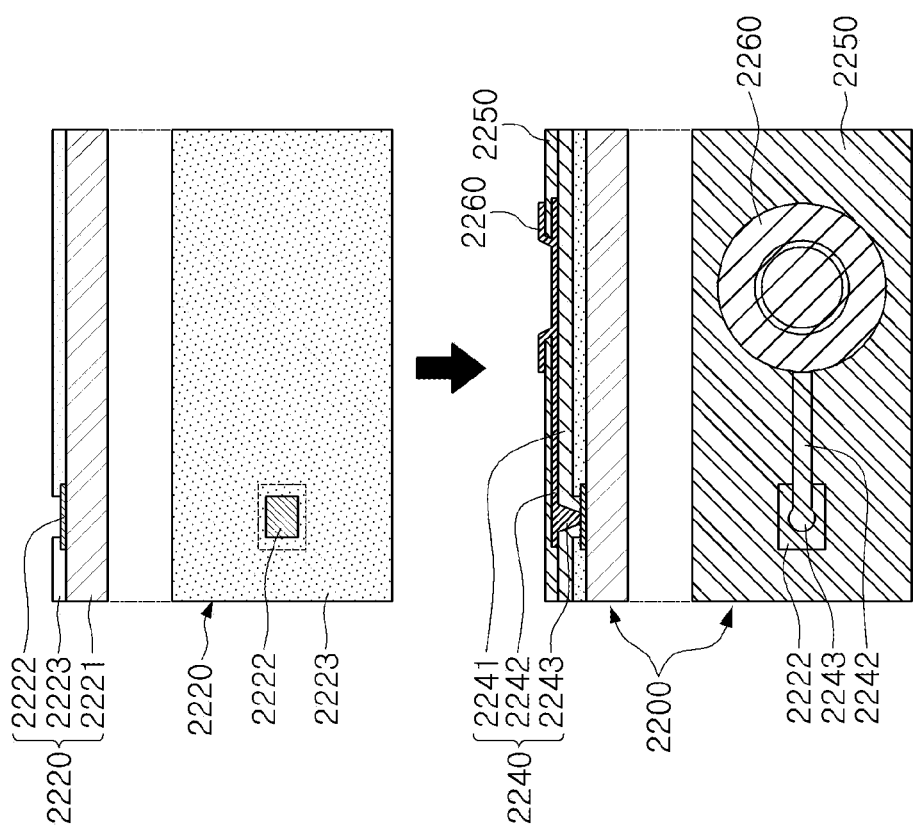
Figure 4:
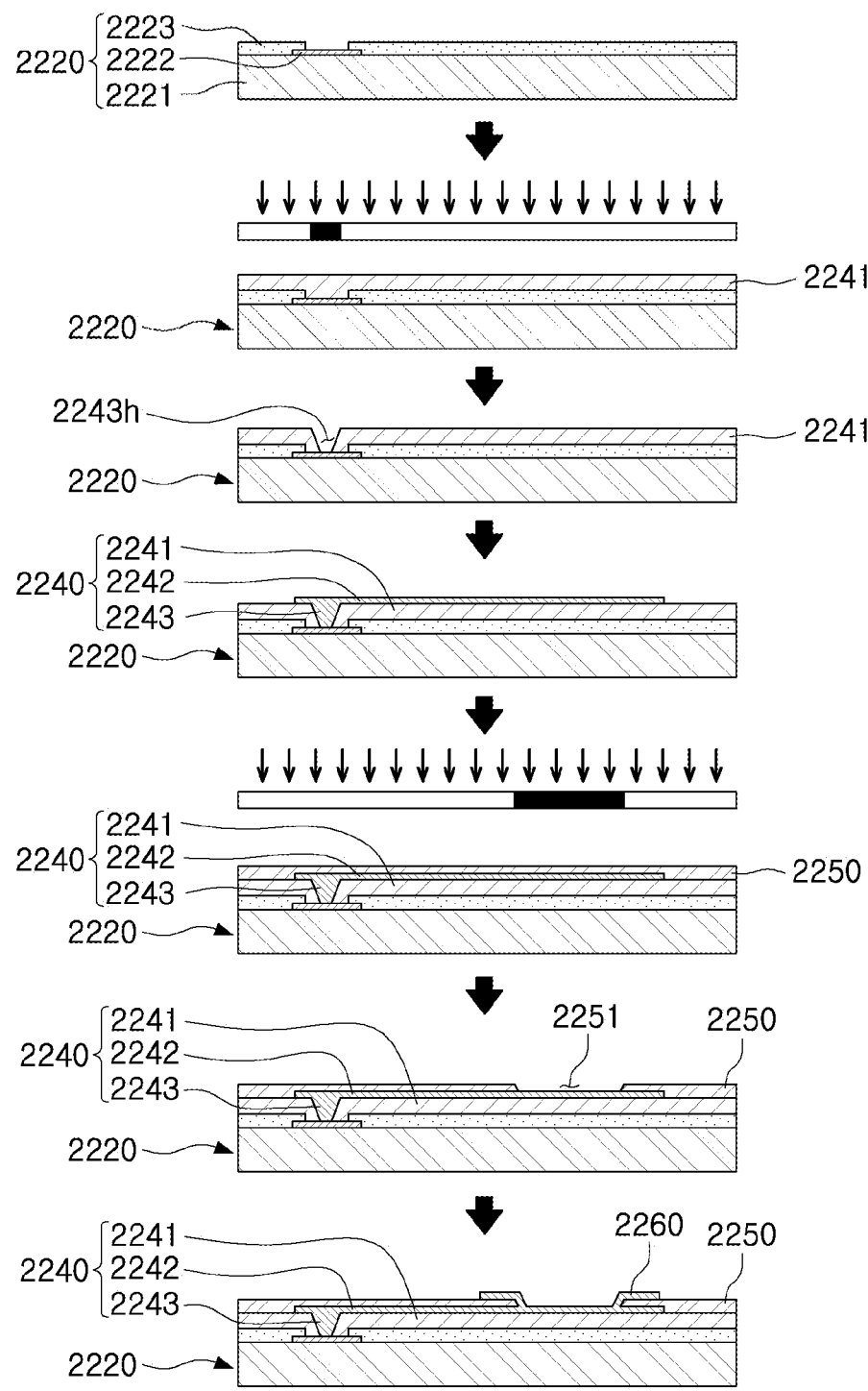
FIG. 4 is a schematic cross-sectional view illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. Since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
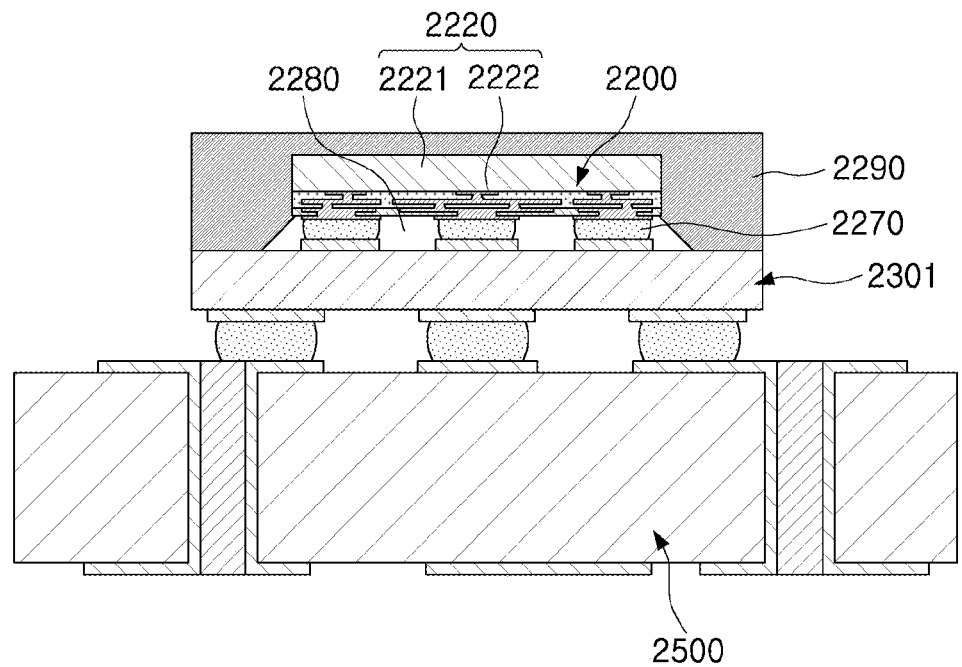
FIG. 5 is a schematic cross-sectional view illustrating a case in which a fan-in semiconductor package is mounted on an interposer substrate and is ultimately mounted on a mainboard of an electronic device.
Figure 6:
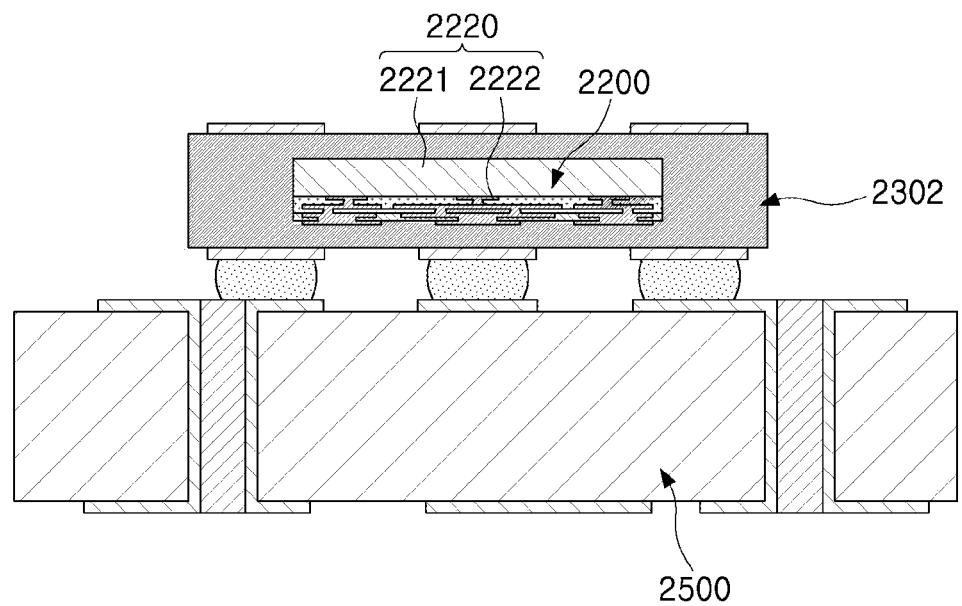
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, low melting point metal or alloy balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
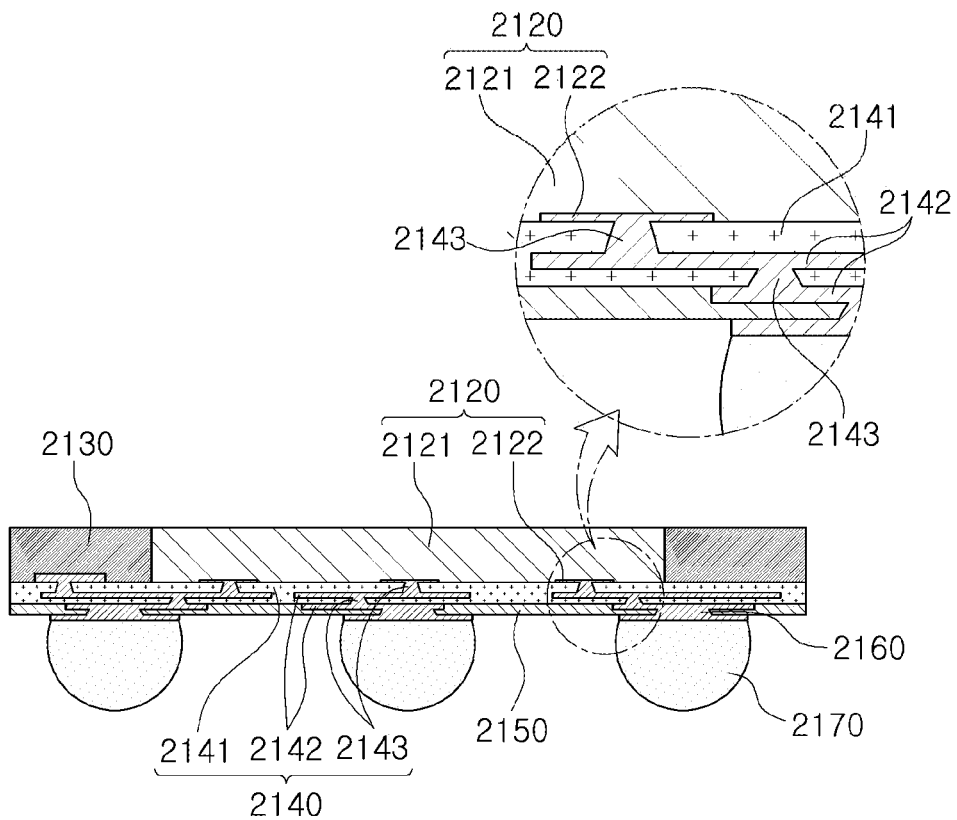
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Low melting point metal or alloy balls 2170 may further be formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection structure 2140 may be formed after the encapsulant 2130 is formed outside the semiconductor chip 2120. In this case, the connection structure 2140 may be formed after the semiconductor chip 2120 is encapsulated, and the vias 2143 connected to the redistribution layers may thus have a width that becomes small as they become close to the semiconductor chip (see an enlarged region).

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
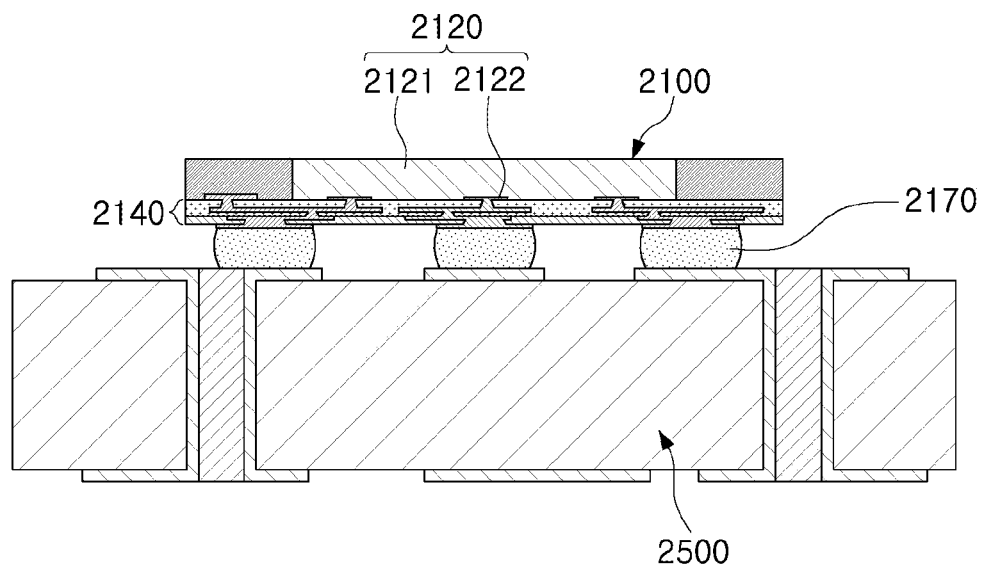
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through low melting point metal or alloy balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

The spirit and scope of the present disclosure will hereinafter be described in detail with reference to exemplary embodiments of the present disclosure.

Figure 9:
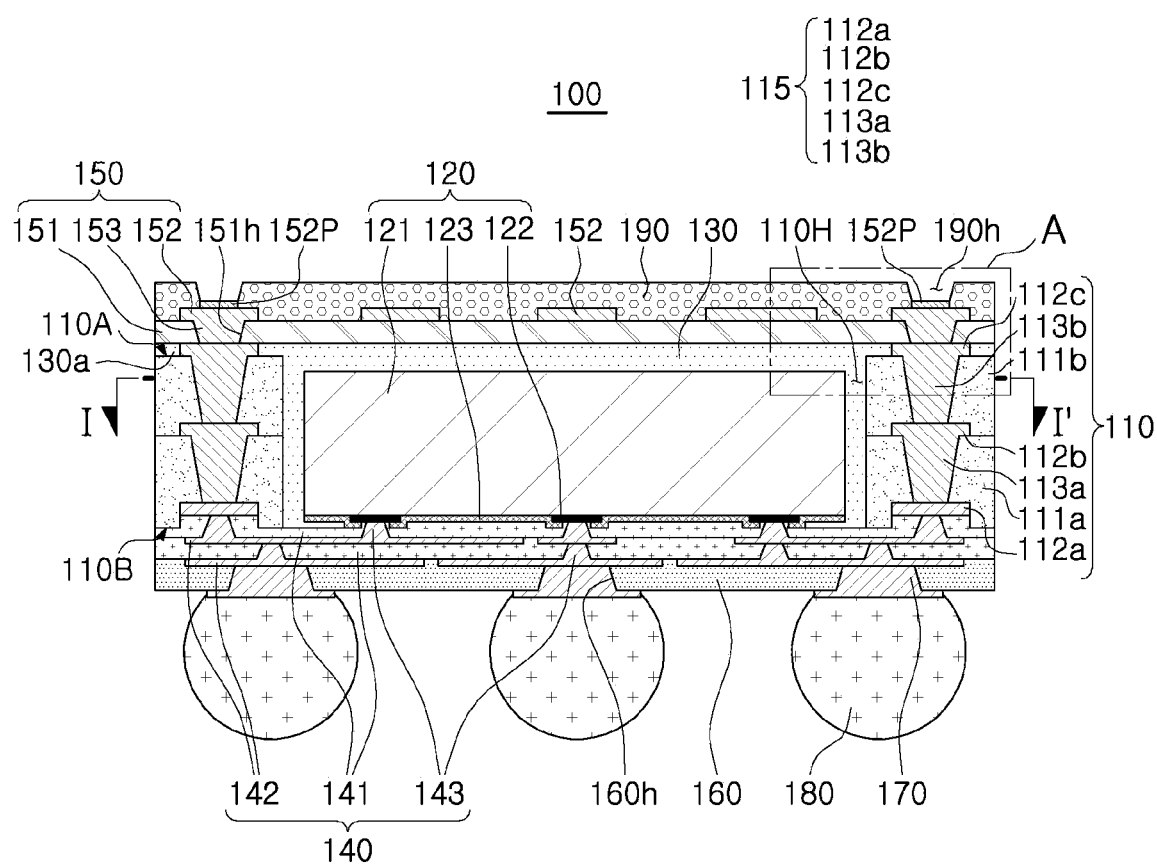
FIG. 9 is a schematic cross-sectional view illustrating a semiconductor package according to an exemplary embodiment in the present disclosure.
Figure 10:
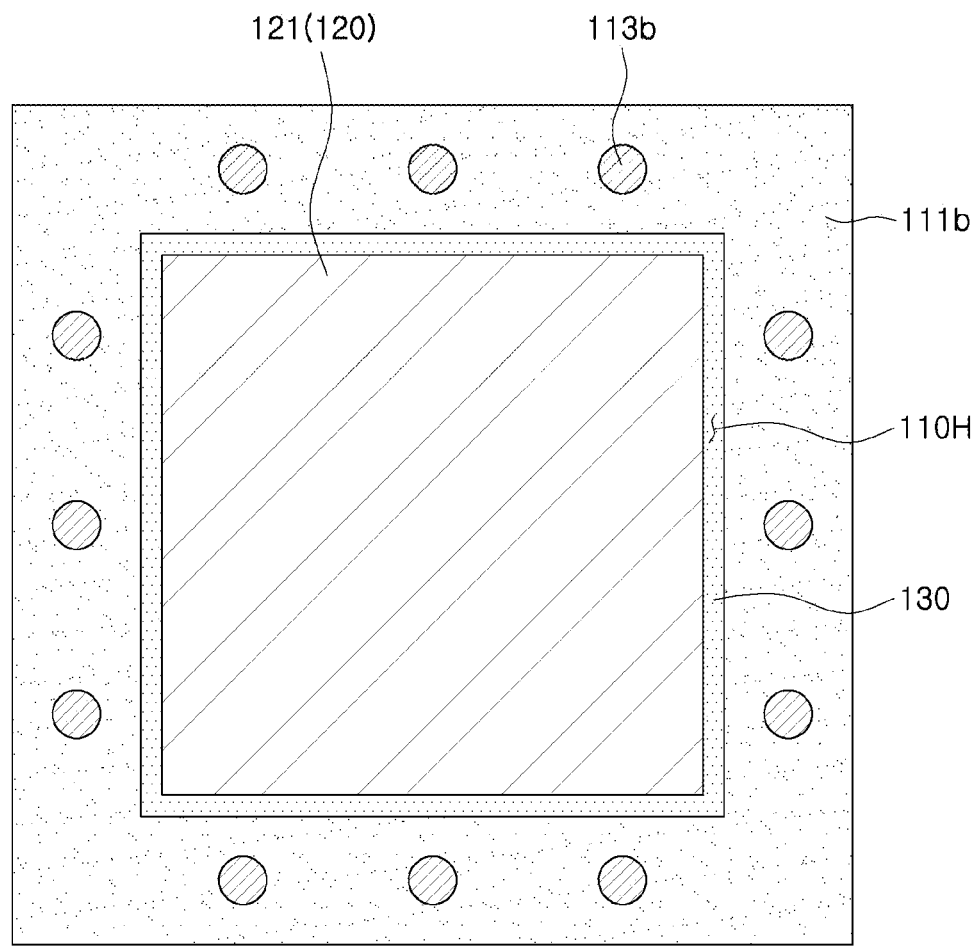
FIG. 10 is a plan view taken along line I-I' of the semiconductor package of FIG. 9.

FIG. 9 is a schematic cross-sectional view illustrating a semiconductor package according to an exemplary embodiment in the present disclosure, and FIG. 10 is a plan view taken along line I-I' of the semiconductor package of FIG. 9.

Referring to FIGS. 9 and 10, a semiconductor package 100 may include a frame 110 having a cavity 110H and including a wiring structure 115 connecting first and second surfaces 110A and 110B opposing each other to each other, a first connection structure 140 disposed on the second surface 110B of the frame and including first redistribution layers 142 connected to the wiring structure 115, a semiconductor chip 120 disposed on the first connection structure 140 within the cavity 110H and having connection pads 122 connected to the first redistribution layer 142, and an encapsulant 130 disposed on the first connection structure 140 and encapsulating the semiconductor chip 120.

The semiconductor package 100 may further include a second connection structure 150 disposed on an upper surface of the encapsulant 130. The second connection structure 150 used in the present exemplary embodiment may include a first insulating layer 151 disposed on the upper surface of the encapsulant 130 and the first surface 110A of the frame 110, a second redistribution layer (referred to as a "backside redistribution layer") disposed on the insulating layer 151, and vias 153 penetrating through the insulating layer 151 and connecting the wiring structure 115 and the second redistribution layer 152 to each other. For example, the insulating layer 151 may include a photoimagable dielectric (PID). When the insulating layer 151 is formed of the PID, the second redistribution layer 152 may be formed as a fine pattern.

The encapsulant 130 may be substantially coplanar with an upper surface of the wiring structure 115. In some exemplary embodiments, the encapsulant may be formed of a non-photoimagable dielectric. As described above, according to the present exemplary embodiment, the upper surface of the wiring structure 115 and the upper surface of the encapsulant 130 may be planarized, such that the insulating layer 151 may be precisely applied at a uniform thickness to the planarized upper surfaces, and surfaces of the insulating layer 151 and the encapsulant 150 may be effectively closely adhered to each other, resulting in improvement of structural reliability.

For the purpose of this planarization, the encapsulant 130 may extend up to the first surface 110A of the frame 110 so as to cover the wiring structure 115. The encapsulant 130 may be polished until it is exposed to the upper surface of the wiring structure 115, thereby planarizing the upper surface of the wiring structure 115 and the upper surface of the encapsulant 130.

The frame 110 used in the present exemplary embodiment may include a first insulating layer 111a in contact with the first connection structure 140 and a second insulating layer 111b disposed on the first insulating layer 111a. The wiring structure 115 used in the present exemplary embodiment may include a first wiring pattern 112a embedded in the first insulating layer 111a and in contact with the first connection structure 140, a second wiring pattern 112b disposed on the other surface of the first insulating layer 111a opposing one surface of the first insulating layer 111a in which the first wiring pattern 112a is embedded, and a third wiring pattern 112c disposed on the second insulating layer 111b.

In addition, the wiring structure 115 may include first wiring vias 113a penetrating through the first insulating layer 111a and connecting the first and second wiring patterns 112a and 112b to each other and second wiring vias 113b penetrating through the second insulating layer 111b and connecting the second and third wiring patterns 112b and 112c to each other.

Figure 11:
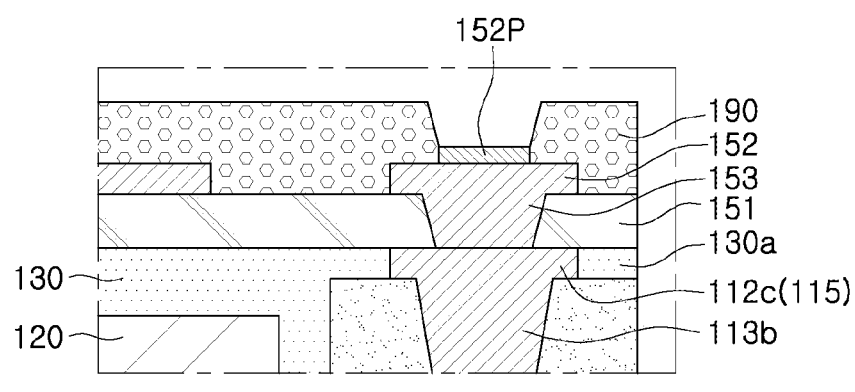
FIG. 11 is an enlarged cross-sectional view illustrating a partial region (region A) of the semiconductor package illustrated in FIG. 9.

In detail, referring to FIG. 11, the encapsulant 130 may have an extending portion 130a on the first surface 110A of the frame 110, as described above. The wiring structure 115 may have a structure protruding from the first surface 110A of the frame 110. The third wiring pattern may protrude from the first surface 110A of the frame 110. In a planarizing process, the extending portion 130 of the encapsulant 130 may have an upper surface planarized to be coplanar with an upper surface of the third wiring pattern 112c that protrudes. Therefore, the insulating layer 151 for forming the second redistribution layer 152 may be formed on the planarized upper surface to thus have a uniform thickness. It may be advantageous in finely forming the second redistribution pattern 152 and the vias 153. Particularly, when the insulating layer 151 is formed of the PID, an error due to a thickness deviation in performing an exposure process may be reduced, and the vias 153 having a fine pitch may be more precisely formed.

The insulating layer 151 may have openings 151h opening at least portions of the third wiring pattern 112c. The second redistribution layer 152 may be formed on the insulating layer 151, and may be connected to the third wiring pattern 112c through the vias 153 formed in the openings 151h. In the present exemplary embodiment, the encapsulant 130 may have the upper surface planarized to be coplanar with the upper surface of the third wiring pattern 112c, and the openings 151h may thus penetrate through only the insulating layer 151 without passing through the encapsulant 130.

The connection structure 140 used in the present exemplary embodiment may include two first redistribution layers 142, and the first redistribution layer 142 of the connection structure 140 may be connected to the connection pads 122 of the semiconductor chip 120 and the wiring structure 115 (particularly, the first wiring pattern 112a).

A first passivation layer 160 may be formed on a lower surface of the connection structure 140. The first passivation layer 160 may have openings 160h exposing at least portions of the first redistribution layer 142. Underbump metal layers 170 may be disposed in the openings 160h, respectively, and may be connected to electrical connection metals 180, respectively.

The respective components included in the semiconductor package 100 according to the present exemplary embodiment will hereinafter be described in more detail.

The frame 110 may improve rigidity of the semiconductor package 100 depending on certain materials of the insulating layers 111a and 111b, and serve to secure uniformity of a thickness of the encapsulant 130. The frame 110 may have the cavity 110H penetrating through the insulating layers 111a and 111b. The semiconductor chip 120 may be disposed in the cavity 110H, and a passive component may be disposed together with the semiconductor chip 120 in the cavity 110H in some exemplary embodiments. The cavity 110H may have a form in which walls thereof surround the semiconductor chip 120, but is not necessarily limited thereto. The frame 110 may include the wiring patterns 112a, 112b, and 112c and the wiring vias 113a and 113b, in addition to the insulating layers 111a and 111b. In this case, the wiring patterns 112a, 112b, and 112c and the wiring vias 113a and 113b may serve as vertical connection members in a package structure. In some exemplary embodiment, the semiconductor package 100 may have a vertical connection member such as a metal post used to substitute the wiring structure 115 in the frame 110.

Figure 14:
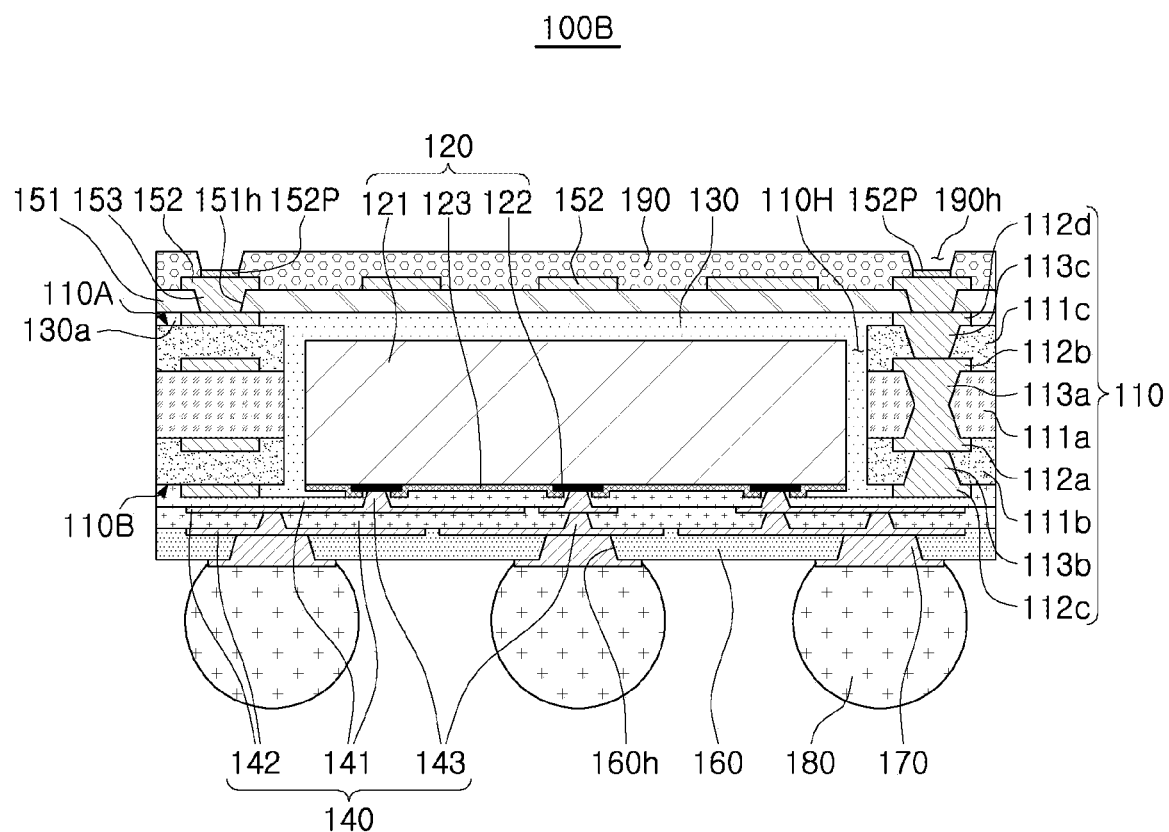

A form in which the wiring structure of the frame used in the present exemplary embodiment includes three wiring patterns 112a, 112b, and 112c and the wiring vias 113a and 113b connecting the three wiring patterns 112a, 112b, and 112c to each other is exemplified, but the number of layers in the wiring structure may be different from that described above and various other wiring structures may be implemented (see FIG. 14). A material of each of the insulating layers 111a and 111b may be a thermosetting resin such as an epoxy resin, a thermoplastic resin such as a polyimide resin, a resin in which the thermosetting resin and the thermoplastic resin are mixed with an inorganic filler, for example, Ajinomoto Build-up Film (ABF), or the like, but is not limited thereto. Alternatively, a material in which the resin described above is impregnated together with an inorganic filler in a core material such as a glass fiber (or a glass cloth or a glass fabric), for example, prepreg, or the like, may also be used as the material of each of the insulating layers 111a and 111b. In some exemplary embodiments, a PID resin may also be used as the material of the each of the insulating layers 111a and 111b.

As described above, the wiring structure including the wiring patterns 112a, 112b, and 112c and the wiring vias 113a and 113b may provide a vertical connection path of the semiconductor package 100 and serve to redistribute the connection pads 122 of the semiconductor chip 120. A material of each of the wiring patterns 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring patterns 112a, 112b, and 112c may perform various functions depending on designs of corresponding layers. For example, the wiring patterns 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring patterns 112a, 112b, and 112c may include via pads, wire pads, electrical connection structure pads, and the like. Each of the wiring patterns 112a, 112b, and 112c may be formed by any known plating process, and may include a seed layer and a conductor layer. A thickness of each of the wiring patterns 112a, 112b, and 112c may be greater than that of the first redistribution layer 142.

As illustrated in FIG. 9, the first wiring pattern 112a may be recessed into the first insulating layer 111a. As described above, when the first wiring pattern 112a is recessed into the first insulating layer 111a, such that a lower surface of the first insulating layer 111a and a lower surface of the first wiring pattern 112a have a step therebetween, a phenomenon in which a material of the encapsulant 130 bleeds to pollute the first wiring pattern 112a may be prevented.

The wiring vias 113a and 113b may electrically connect the wiring patterns 112a, 112b, and 112c formed on different layers to each other, resulting in an electrical path in the frame 110. A material of each of the wiring vias 113a and 113b may be a conductive material such as copper (Cu), aluminum (Al), silver (Ag), tin (Sn), gold (Au), nickel (Ni), lead (Pb), titanium (Ti), or alloys thereof. Each of the wiring vias 113a and 113b may be a filled-type via filled with the conductive material, or be a conformal-type via in which the conductive material may be formed along a wall of each of via holes. In addition, each of the wiring vias 113a and 113b may have a tapered shape. Each of the wiring vias 113a and 113b may be formed by a plating process, and may include a seed layer and a conductor layer.

When holes for the first wiring vias 113a are formed, some of the pads of the first wiring pattern 112a may serve as a stopper. Therefore, it may be advantageous in a process that each of the first wiring vias 113a has a tapered shape of which a width of an upper end is greater than that of a lower end. In this case, the first wiring vias 113a may be integrated with pad patterns of the second wiring pattern 112b. In addition, when holes for the second wiring vias 113b are formed, some of the pads of the second wiring pattern 112b may serve as a stopper. Therefore, it may be advantageous in a process that each of the second wiring vias 113b has a tapered shape of which a width of an upper end is greater than that of a lower end, similar to the first wiring via 113a. In this case, the second wiring vias 113b may be integrated with pad patterns of the third wiring pattern 112c. Meanwhile, although not illustrated in the drawings, in some exemplary embodiments, a metal layer (not illustrated) may be disposed on the walls of the cavity 110H of the frame 110 in order to block electromagnetic waves or dissipate heat. The metal layer (not illustrated) may surround the semiconductor chip 120.

The semiconductor chip 120 may be an integrated circuit (IC) provided in an amount of several hundred to several million or more elements integrated in a single chip. In this case, the IC may be, for example, an application processor chip such as a central processor (for example, a CPU), a graphic processor (for example, a GPU), a digital signal processor, a cryptographic processor, a microprocessor, a microcontroller, or the like, but is not limited thereto. The IC may be a power management IC (PMIC), a memory chip such as a volatile memory (for example, a DRAM), a non-volatile memory (for example, a ROM), a flash memory, or the like, or a logic chip such as an analog-to-digital converter, an application-specific IC (ASIC), or the like.

The semiconductor chip 120 may be an integrated circuit in a bare state in which separate bumps or redistribution layers are not formed. However, the semiconductor chip 120 is not limited thereto, and may be a packaged-type IC, if necessary. The integrated circuit may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide layer, a nitride layer, or the like, or a double layer of an oxide layer and a nitride layer. An insulating layer (not illustrated), and the like, may further be disposed in other required positions. Meanwhile, an active surface of the semiconductor chip 120 refers to a surface of the semiconductor chip 120 on which the connection pads 122 are disposed, and an inactive surface of the semiconductor chip 120 refers to a surface of the semiconductor chip 120 opposing the active surface. In this case, when the passivation layer 123 is formed on the active surface of the semiconductor chip 120, a position relationship of the active surface of the semiconductor chip 120 may be determined on the basis of the lowermost surface of the passivation layer 123.

The encapsulant 130 may encapsulate the frame 110 and the semiconductor chip 120, and may fill at least a portion of the cavity 110H. The encapsulant 130 may be formed of an insulating material. In this case, the insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, Bismaleimide Triazine (BT), or the like. In addition, a molding material such as an epoxy molding compound (EMC) or a photosensitive material, that is, a photoimagable encapsulant (PIE) may be used as the insulating material. In some exemplary embodiments, a material in which an insulating resin such as a thermosetting resin or a thermoplastic resin is impregnated in an inorganic filler and/or a core material such as a glass fiber (or a glass cloth or a glass fabric) may also be used as the insulating material. The insulating layer 151 disposed on the upper surface of the encapsulant 130 may be formed of a material that is the same as or similar to that of the encapsulant 130.

The second redistribution layer 152 may be disposed on the insulating layer 151. The second redistribution layer 152 may include a conductive material such as copper (Cu), aluminum (Al), silver (Ag), tin (Sn), gold (Au), nickel (Ni), lead (Pb), titanium (Ti), or alloys thereof, similar to the first redistribution layer 142 and the wiring patterns 112a, 112b, and 112c. The second redistribution layer 152 may perform various functions depending on a design. For example, the second redistribution layer 152 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second redistribution layer 152 may include via pads, wire pads, electrical connection structure pads, and the like. The second redistribution layer 152 may be formed by any known plating process, and may include a seed layer and a conductor layer. Each of the vias 153 may also include a conductive material such as copper (Cu), aluminum (Al), silver (Ag), tin (Sn), gold (Au), nickel (Ni), lead (Pb), titanium (Ti), or alloys thereof, similar to the second redistribution layer 152. Each of the vias 153 may be a filled-type via filled with the conductive material, or be a conformal-type via in which the conductive material may be formed along a wall of each of via holes. In addition, each of the vias 153 may have a tapered shape. The vias 153 may be formed together with the second redistribution layer 152 by a plating process, and may include a seed layer and a conductor layer.

The connection structure 140 may be configured to redistribute the connection pads 122 of the semiconductor chip 120. Several tens to several hundreds of connection pads 122 of the semiconductor chip 120 having various functions may be redistributed by the connection structure 140, and may be physically or electrically externally connected through the electrical connection metals 180 depending on functions. A form in which the connection structure 140 includes two insulating layers 141, two first redistribution layers 142, and two vias 143, as described above, is illustrated, but in another exemplary embodiment, the connection structure 140 may be implemented as a single layer or be implemented as a larger number of layers than those described above.

A material of each of the insulating layers 141 may be an insulating material. Here, the insulating material may be a PID. In this case, a fine pitch may be introduced through a photo-via, and several tens to several millions of connection pads 122 of the semiconductor chip 120 may thus be very effectively redistributed.

The first redistribution layers 142 may redistribute the connection pads 122 of the semiconductor chip 120 to electrically connect the connection pads 122 to the electrical connection metals 180. A material of each of the first redistribution layers 142 may also be a conductive material such as copper (Cu), aluminum (Al), silver (Ag), tin (Sn), gold (Au), nickel (Ni), lead (Pb), titanium (Ti), or alloys thereof. The first redistribution layers 142 may also perform various functions depending on designs. For example, the first redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first redistribution layers 142 may include via pads, electrical connection structure pads, and the like. The vias 143 may electrically connect the first redistribution layers 142 formed on different layers to each other, and may be used particularly to electrically connect the connection pads 122 of the semiconductor chip 120 and the first redistribution layers 142 to each other. The vias 143 may be in physical contact with the connection pads 122 when the semiconductor chip 120 is a bare die. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may also be completely filled with the conductive material, or the conductive material may be formed along a wall of each of the vias. In addition, each of the vias 143 may also have a tapered shape.

The first and second passivation layers 160 and 190 may be provided as layers for protecting the semiconductor package 100 from external physical or chemical damage. In detail, the first passivation layer 160 positioned on a lower level may be provided in order to protect the connection structure 140, and the second passivation layer 190 positioned on a higher level may be provided in order to protect the second redistribution layer 152. Each of the first and second passivation layers 160 and 190 may include an insulating resin and an inorganic filler, but may not include a glass fiber. For example, the first and second passivation layers 160 and 190 may be formed of ABF, but are not limited thereto, and may be formed of a PID. The second passivation layer 190 may have openings 190h exposing partial regions of the second redistribution layer 152, similar to the first passivation layer 160. A surface treatment layer 152P may be formed on the exposed regions of the second redistribution layer 152.

The underbump metal layers 170 may be used in order to improve connection reliability of the electrical connection metals 180. That is, the underbump metal layers 170 may improve board level reliability of the semiconductor package 100 according to the present exemplary embodiment. The number of underbump metal layers 170 may be several tens to several tens of thousands. The respective underbump metal layers 170 may be connected to the first redistribution layer 142 through the openings 160h penetrating through the first passivation layer 160. The underbump metal layers 170 may be formed by any known metallization method using a metal, but are not limited thereto.

The electrical connection metals 180 may be configured to physically or electrically externally connect the semiconductor package 100. For example, the semiconductor package 100 may be mounted on the mainboard of the electronic device through the electrical connection metals 180. Each of the electrical connection metals 180 may be formed of a low melting point metal such as tin (Sn) or alloys including tin (Sn). In more detail, each of the electrical connection metals 180 may be formed of a solder, or the like. However, this is only an example, and a material of each of the electrical connection metals 180 is not particularly limited thereto. Each of the electrical connection metals 180 may be a land, a ball, a pin, or the like. The electrical connection metals 180 may be formed as a multilayer or single layer structure. When the electrical connection metals 180 are formed as a multilayer structure, the electrical connection metals 180 may include a copper (Cu) pillar and a solder. When the electrical connection metals 180 are formed as a single layer structure, the electrical connection metals 180 may include a tin-silver solder or copper (Cu). However, this is only an example, and the electrical connection metals 180 are not limited thereto. The number, an interval, a disposition form, and the like, of electrical connection metals 180 are not particularly limited, but may be sufficiently modified depending on design particulars by those skilled in the art. For example, the electrical connection metals 180 may be provided in an amount of several tens to several thousands according to the number of connection pads 122, or may be provided in an amount of several tens to several thousands or more or several tens to several thousands or less.

At least one of the electrical connection metals 180 may be disposed in a fan-out region. The fan-out region refers to a region that does not overlap a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

FIGS. 12A through 12G are cross-sectional views for describing main processes of a method of manufacturing a semiconductor package according to an exemplary embodiment in the present disclosure.

Figure 12A:
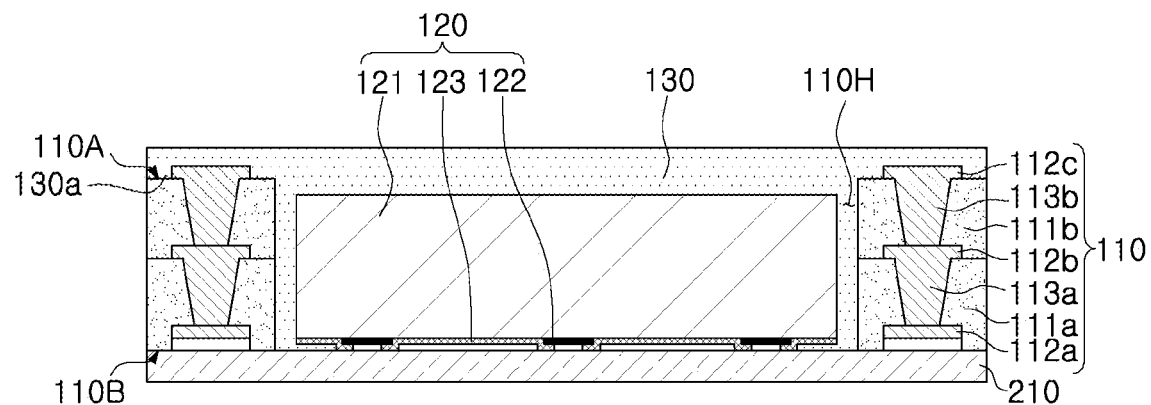
FIGS. 12A through 12G are cross-sectional views for describing main processes of a method of manufacturing a semiconductor package according to an exemplary embodiment in the present disclosure.

Referring to FIG. 12A, the semiconductor chip 120 and the frame 110 having the cavity 110H in which the semiconductor chip 120 is accommodated may be disposed on a first adhesive film 210, and the encapsulant 130 encapsulating the semiconductor chip 120 may be formed.

The frame 110 used in the present exemplary embodiment may include the wiring structure together with the first and second insulating layers 111a and 111b, as described above, and the wiring structure may include the three wiring patterns 112a, 112b, and 112c and the wiring vias 113a and 113b connecting the three wiring patterns 112a, 112b, and 112c to each other. The first adhesive film 210 may be attached to a lower side of the first insulating layer 111a. For example, the first adhesive film 210 may be a tape or the like including an epoxy resin. The semiconductor chip 120 may be mounted in the cavity 110H of the frame 110, and the encapsulant 130 encapsulating the semiconductor chip 120 may be formed using an appropriate encapsulating material. The encapsulant 130 may extend up to the upper surface of the frame 110 to cover the third wiring pattern 112c.

Figure 12B:
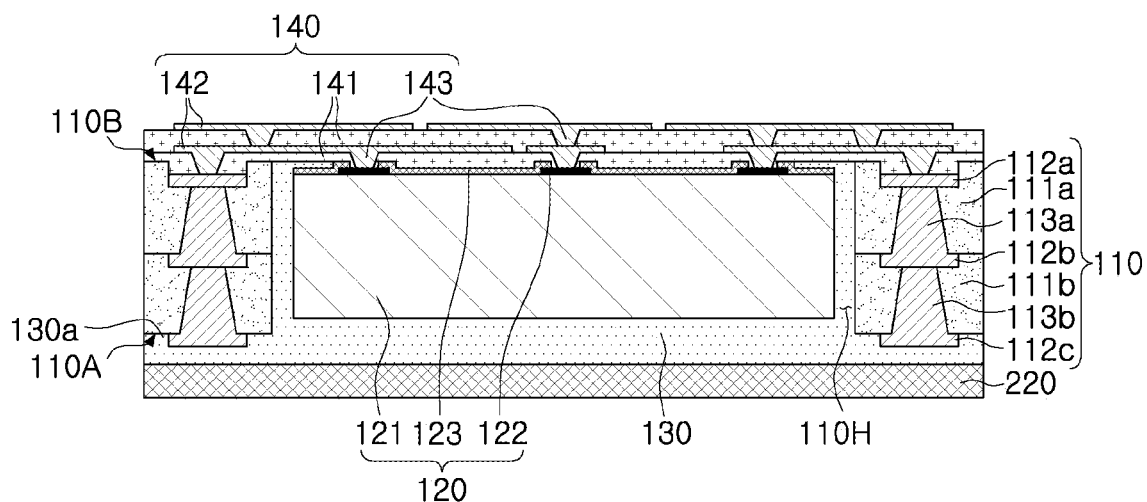

Then, referring to FIG. 12B, a second adhesive film 220 may be attached to the upper surface of the encapsulant 130, the first adhesive film 210 may be removed, and the connection structure 140 may then be formed on a surface from which the first adhesive film 210 is removed.

The connection structure 140 may be formed by forming the insulating layer 141 by a lamination or applying method, forming via holes in the insulating layer 141, and forming the first redistribution layer 142 and the vias 143 by electroplating or electroless plating. When a PID is used as a material of the insulating layer, the via holes may be formed at a fine pitch by a photolithography method.

Figure 12C:
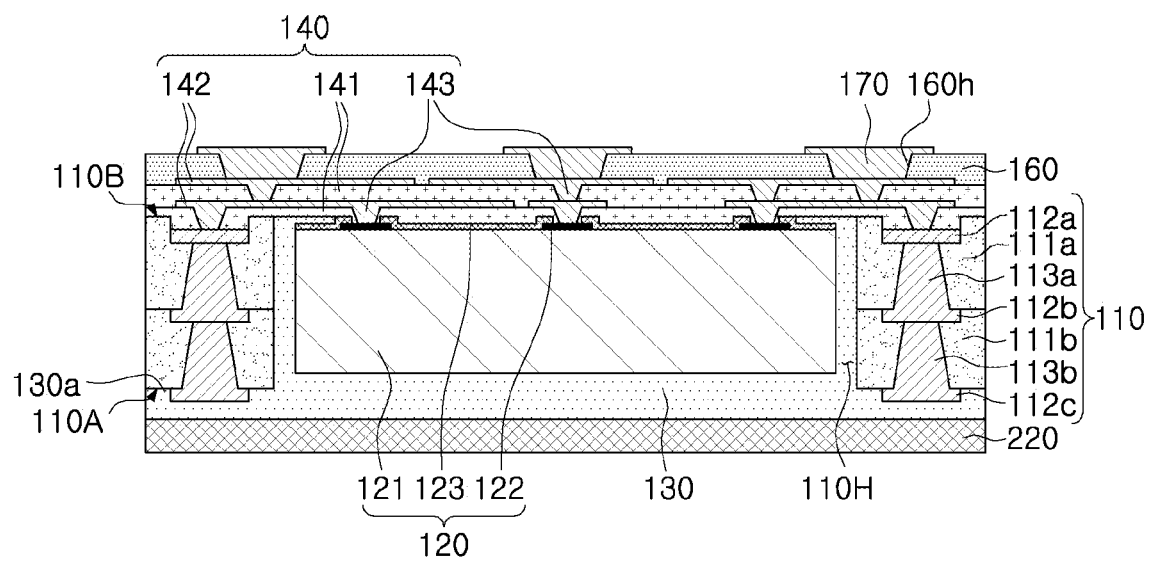

Then, referring to FIG. 12C, the first passivation layer 160 and the underbump metal layers 170 may be formed.

The first passivation layer 160 may be formed on the lower surface of the connection structure 140, and the plurality of openings 160h exposing partial regions of the first redistribution layer 142 may be formed in the first passivation layer 170. The underbump metal layers 170 may be formed on the first passivation layer 160 so as to be connected to the exposed regions of the first redistribution layer 142 through the plurality of openings 160h.

Figure 12D:
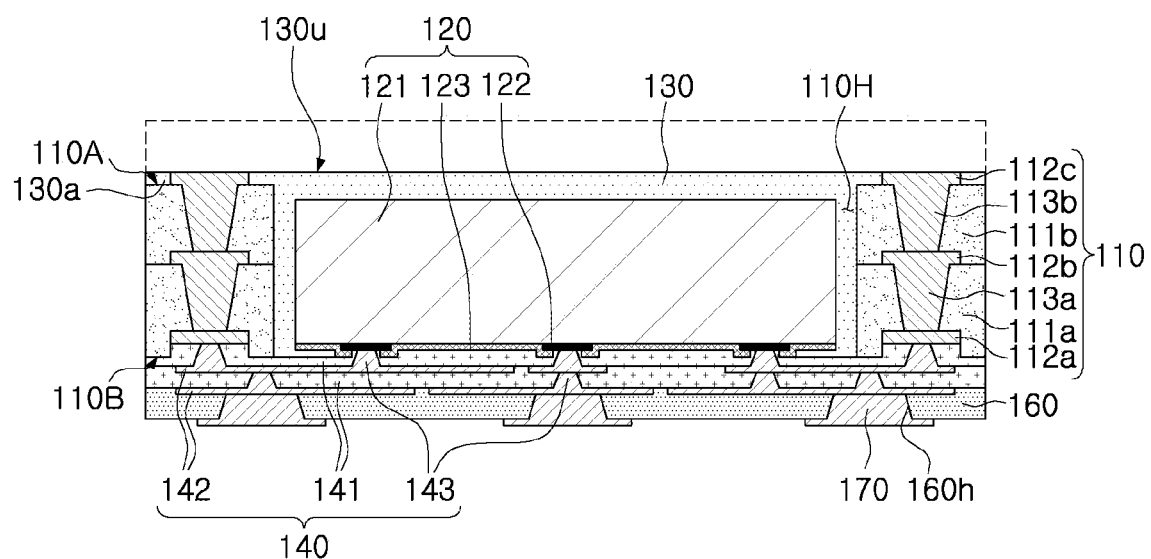

Then, referring to FIG. 12D, the second adhesive film 220 may be removed from the encapsulant 130, and a planarization process may be performed on the upper surface of the encapsulant 130.

The present planarization process may be performed by polishing the upper surface of the encapsulant 130. The polishing of the encapsulant 130 may be performed until the upper surface of the wiring structure, that is, the upper surface of the third wiring pattern 112c is exposed, and the upper surface of the third wiring pattern 112c and the upper surface of the encapsulant 130 may be coplanar with each other. Particularly, the upper surface of the encapsulant 130 before being planarized may be very rough as much as the subsequent process in a process of removing the second adhesive film 220 is not appropriate, but the roughness of the upper surface of the encapsulant 130 may be alleviated by the present planarization process.

Figure 12E:
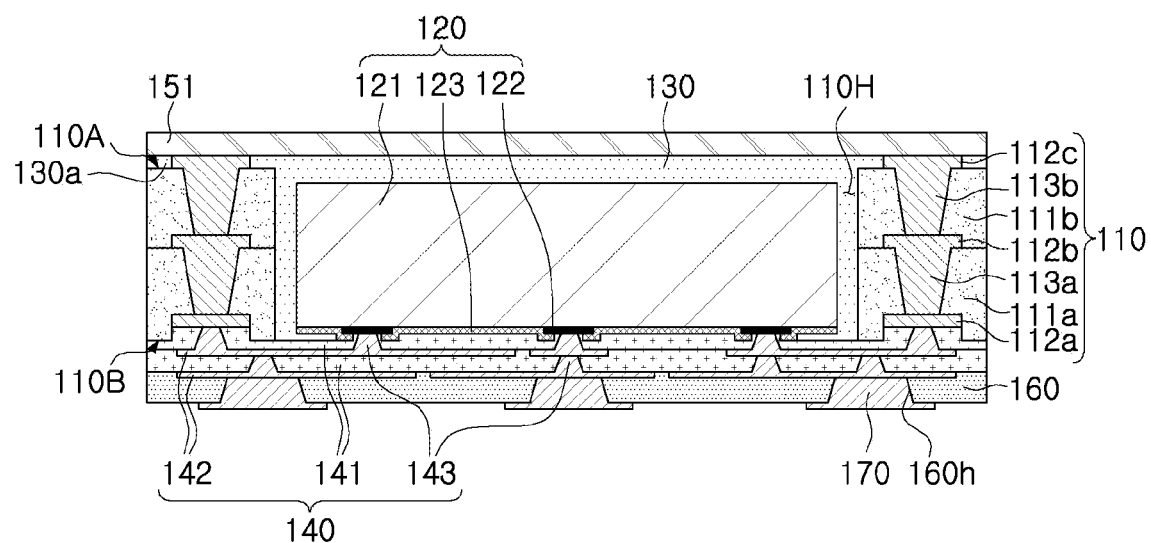
Figure 12F:
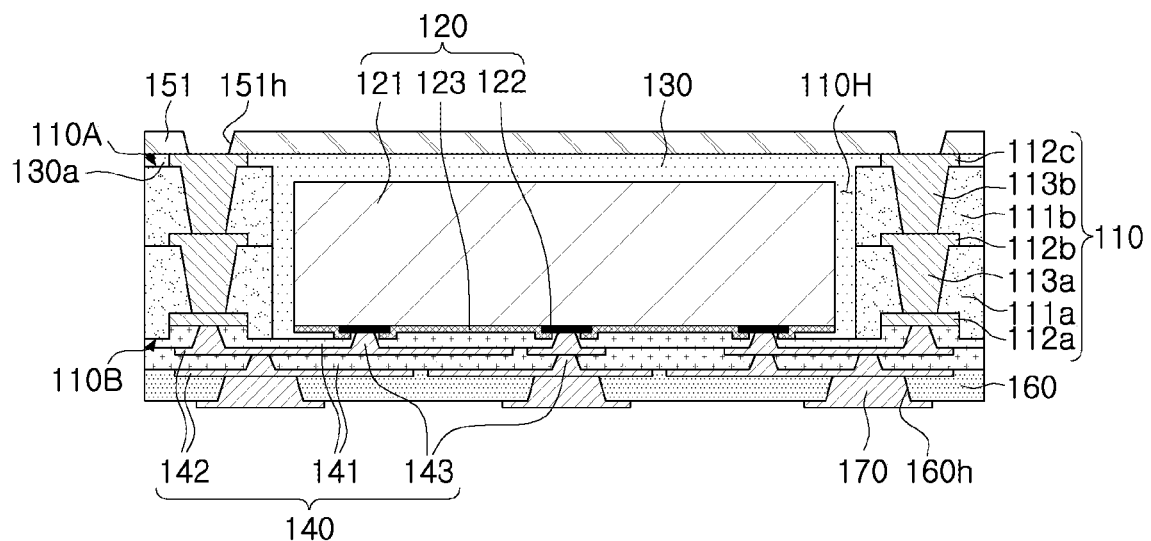

Then, as illustrated in FIG. 12E, the insulating layer 151 may be formed on the planarized upper surfaces of the encapsulant 130 and the wiring structure. Then, as illustrated in FIG. 12F, the openings 151h exposing partial regions of the third wiring pattern 112c may be formed in the insulating layer 151.

The insulating layer 151 may be formed on the planarized upper surfaces of the encapsulant 130 and the wiring structure (that is, the third wiring pattern 112c). The insulating layer 151 may include a PID. When the insulating layer 151 is formed of the PID, the insulating layer 151 may be formed on the planarized surface to thus have a uniform thickness. Therefore, the second redistribution layer 152 and the vias 153 may be precisely formed by an exposure process, or the like. However, in the present exemplary embodiments, the openings 151h may penetrate through only the insulating layer 151 without passing through the encapsulant 130, and expose the third wiring pattern 112c.

Figure 12G:
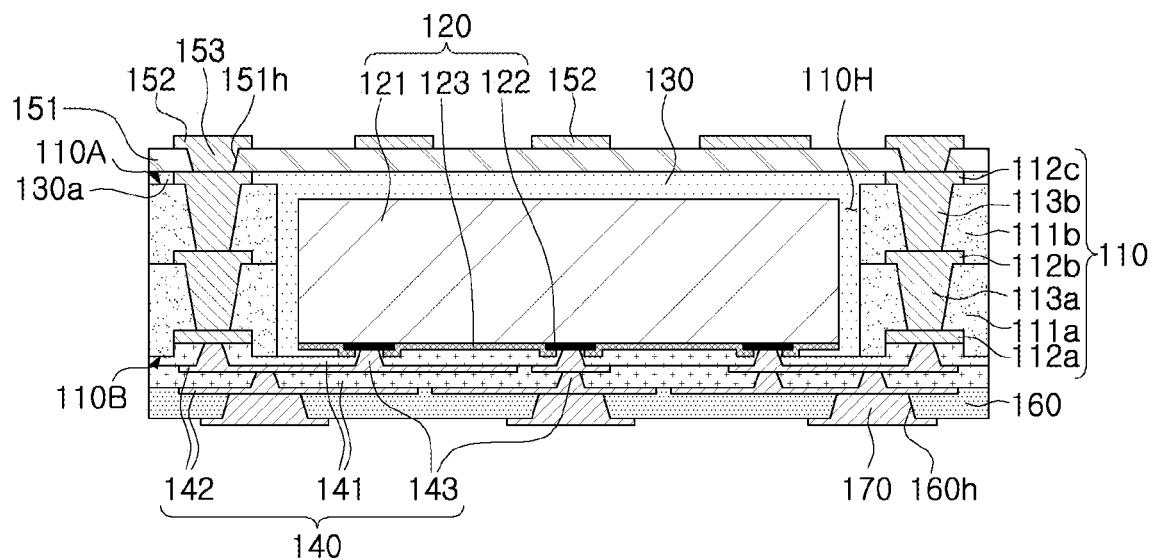

Then, referring to FIG. 12G, the second redistribution layer 152 may be formed on the insulating layer 151 and the vias 153 may be filled the openings 151h in the insulating layer 151.

In the present process, a dry film (DF) may be formed on the insulating layer 152, and a region in which the second redistribution layer 152 is to be formed may be selectively removed by a photolithography process. Then, a plating process may be performed using the patterned dry film (DF), and the dry film (DF) may be removed to obtain the second redistribution layer 152.

Then, the second passivation layer 190 may be formed on the insulating layer 151 so as to cover the second redistribution layer 152, the openings 190h exposing partial regions of the second redistribution layers 152 may be formed in the second passivation layer 190, and the electrical connection metals 180, or the like, may then be formed on the underbump metal layers 170 by any known method, if necessary, on the connection structure 140 (see FIG. 9). Meanwhile, this series of processes may be performed on a panel level. In this case, when a dicing process is changed, a plurality of semiconductor packages 100 may be manufactured by performing the processes once.

Figure 13:
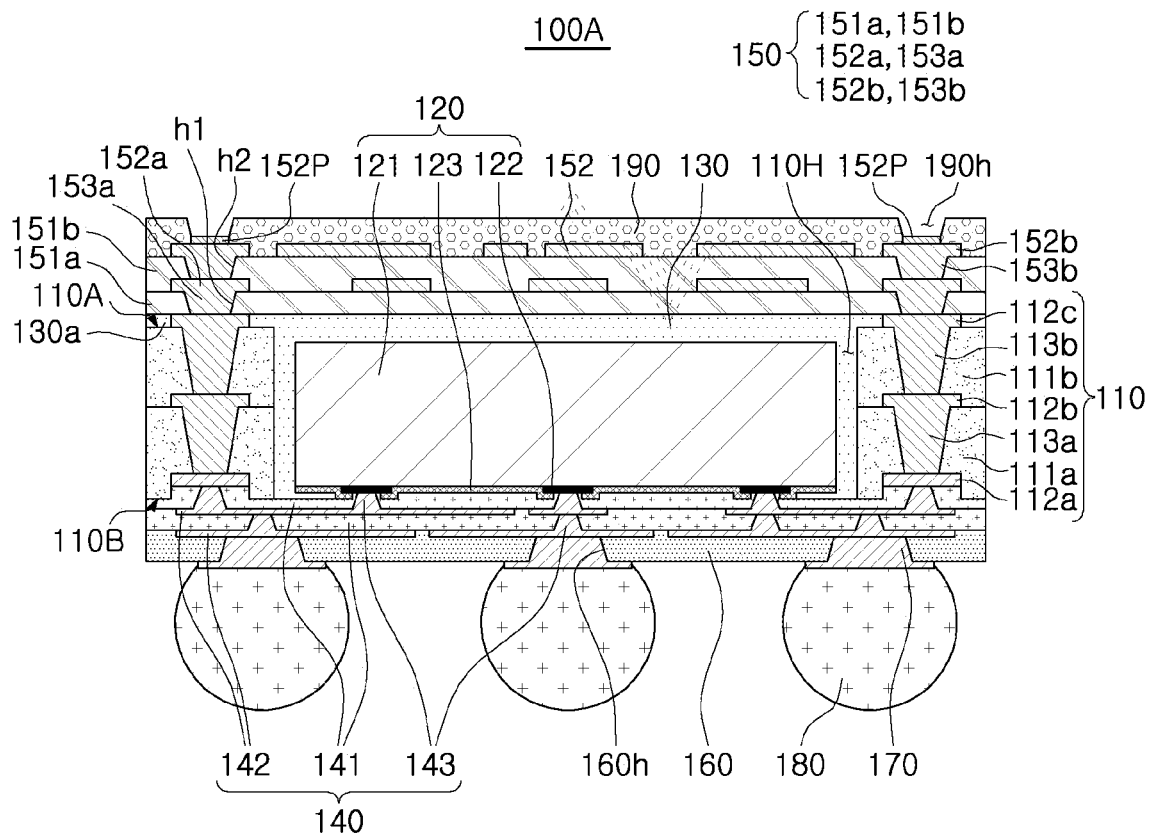
FIGS. 13 and 14 are schematic cross-sectional views illustrating semiconductor packages according to various exemplary embodiments in the present disclosure.

FIG. 13 is a schematic cross-sectional view illustrating a semiconductor package according to another exemplary embodiment in the present disclosure.

Referring to FIG. 13, it may be understood that a semiconductor package 100A according to the present exemplary embodiment has a structure similar to that illustrated in FIGS. 9 through 11 except for a second connection structure 150 including two second redistribution layers 152. Components according to the present exemplary embodiments may be understood with reference to the description for the same or similar components of the semiconductor package 100 illustrated in FIGS. 9 through 11 unless explicitly described otherwise.

The semiconductor package 100A according to the present exemplary embodiment may include the second connection structure 150 opposing a first connection structure 140 and including second redistribution layers 152a and 152b connected to a wiring structure, as well as the first connection structure 140 including first redistribution layers 142. The second connection structure 150 may include a first insulating layer 151a disposed on an encapsulant 130, a lower redistribution layer 152a disposed on the first insulating layer 151a, a second insulating layer 151b disposed on the lower redistribution layer 152a, and an upper redistribution layer 152b disposed on the second insulating layer 151b so as to be connected to the lower redistribution layer 152a.

The lower and upper redistribution layers 152a and 152b may be connected to the wiring structure (particularly, a third wiring pattern 112c) through redistribution vias 153a and 153b, respectively. As described above, the first insulating layer 151a may be formed using a PID on a surface of the encapsulant 130 planarized to be coplanar with an upper surface of the wiring structure. Therefore, the first insulating layer 151a may be formed at a uniform thickness. Therefore, the lower redistribution layer 152a and the redistribution vias 153a may be precisely formed by the subsequent exposure process, or the like. Since the second insulating layer 151b is also formed on the first insulating layer 151a, an effect similar to the effect described above may be expected.

FIG. 14 is a schematic cross-sectional view illustrating a semiconductor package according to another exemplary embodiment in the present disclosure.

Referring to FIG. 14, it may be understood that a semiconductor package 100B according to the present exemplary embodiment has a structure similar to that illustrated in FIGS. 9 through 11 except for a form of a frame 110. Components according to the present exemplary embodiments may be understood with reference to the description for the same or similar components of the semiconductor package 100 illustrated in FIGS. 9 through 11 unless explicitly described otherwise.

A frame 110 used in the present exemplary embodiment may have a structure different from that of the frame 110 described above, and a wiring structure of the frame 110 may thus be modified. In detail, the frame 110 may include a first insulating layer 111a, a first wiring pattern 112a disposed on one surface of the first insulating layer 111a, a second wiring pattern 112b disposed on the other surface of the first insulating layer 111a, a second insulating layer 111b disposed on one surface of the first insulating layer 111a and covering at least portions of the first wiring pattern 112a, a third wiring pattern 112c disposed on the other surface of the second insulating layer 111b opposing one surface of the second insulating layer 111b in which the first wiring pattern 112a is embedded, a third insulating layer 111c disposed on the other surface of the first insulating layer 111a and covering at least portions of the second wiring pattern 112b, a fourth wiring pattern 112d disposed on the other surface of the third insulating layer 111c opposing one surface of the third insulating layer 111c in which the second wiring pattern 112b is embedded, first wiring vias 113a penetrating through the first insulating layer 111a and electrically connecting the first and second wiring patterns 112a and 112b to each other, second wiring vias 113b penetrating through the second insulating layer 111b and electrically connecting the first and third wiring patterns 112a and 112c to each other, and third wiring vias 113c penetrating through the third insulating layer 111c and electrically connecting the second and fourth wiring patterns 112b and 112d to each other.

Since the frame 110 used in the present exemplary embodiment has a larger number of wiring patterns 112a, 112b, 112c, and 112d, first redistribution layers 142 of a connection structure 140 may further be simplified.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring patterns 112c and 112d. The first insulating layer 111a may include an insulating material different from those of the second insulating layer 111b and the third insulating layer 111c. For example, the first insulating layer 111a may be, for example, prepreg including a core material such as a glass fiber, an inorganic filler, and an insulating resin, and the second insulating layer 111b and the third insulating layer 111c may be an ABF or a PID including an inorganic filler and an insulating resin. However, the materials of the first insulating layer 111a and the second and third insulating layers 111b and 111c are not limited thereto. Similarly, the first wiring vias 113a penetrating through the first insulating layer 111a may have a diameter greater than those of the second and third wiring vias 113b and 113c each penetrating through the second and third insulating layers 111b and 111c. In addition, the first wiring via 113a may have an hourglass shape or a cylindrical shape, while the second and third wiring vias 113b and 113c may have tapered shapes of which directions are opposite to each other. Thicknesses of the first to fourth wiring patterns 112a, 112b, 112c, and 112d may be greater than those of the first redistribution layers 142.

As set forth above, according to an exemplary embodiment in the present disclosure, the insulating layer may be formed using the PID on the surface of the encapsulant planarized to be coplanar with the upper surface of the wiring structure. Therefore, the insulating layer may be formed at a uniform thickness. A backside redistribution layer may be precisely formed by the subsequent exposure process, or the like.

While exemplary embodiments have been shown and described above, it will be apparent to those skilled in the art that modifications and variations could be made without departing from the scope of the present invention as defined by the appended claims.

What is claimed is:

1. A semiconductor package comprising:
a frame having a cavity and including a wiring structure connecting first and second surfaces of the frame to each other, the first and second surfaces opposing each other;
a first connection structure disposed on the second surface of the frame and including a first redistribution layer connected to the wiring structure;
a semiconductor chip disposed on the first connection structure within the cavity and having connection pads connected to the first redistribution layer;
an encapsulant encapsulating the semiconductor chip, extending to cover a first surface of the frame, and having an upper surface substantially coplanar with an upper surface of the wiring structure; and
a second connection structure including an insulating layer disposed on the upper surfaces of the encapsulant and the wiring structure, a second redistribution layer disposed on the insulating layer, and vias penetrating through the insulating layer and connecting the wiring structure and the second redistribution layer to each other,
wherein the wiring structure includes a plurality of wiring patterns that are spaced apart from each other in a vertical direction.

2. The semiconductor package of claim 1, wherein the insulating layer includes a photoimagable dielectric (PID).

3. The semiconductor package of claim 1, wherein the wiring structure has a structure protruding from the first surface of the frame.

4. The semiconductor package of claim 3,
wherein one of the plurality of wiring patterns protrudes from the first surface of the frame and is connected to the second redistribution layer.

5. The semiconductor package of claim 1, wherein the insulating layer includes a plurality of insulating layers, and the second redistribution layer and the vias include, respectively, a plurality of second redistribution layers and a plurality of vias each disposed on and in the plurality of insulating layers.

6. The semiconductor package of claim 1, wherein the frame includes a first insulating layer in contact with the first connection structure and a second insulating layer disposed on the first insulating layer, and the plurality of wiring patterns include a first wiring pattern embedded in the first insulating layer and in contact with the first connection structure, a second wiring pattern disposed on the other surface of the first insulating layer opposing one surface of the first insulating layer in which the first wiring pattern is embedded, and a third wiring pattern disposed on the second insulating layer.

7. The semiconductor package of claim 1, wherein the frame includes a first insulating layer and second and third insulating layers disposed on lower and upper surfaces of the first insulating layer, respectively, and the plurality of wiring patterns include first and second wiring patterns disposed on the lower and upper surfaces of the first insulating layer, respectively, a third wiring pattern disposed on the second insulating layer, and a fourth wiring pattern disposed on the third insulating layer.

8. The semiconductor package of claim 1, further comprising a passivation layer disposed on a lower surface of the first connection structure and having a plurality of openings exposing the first redistribution layer.

9. The semiconductor package of claim 8, further comprising:

a plurality of underbump metal (UBM) layers disposed in the openings of the passivation layer and connected to the first redistribution layer; and a plurality of electrical connection metals disposed on the plurality of UBM layers, respectively.

10. The semiconductor package of claim 1, wherein the insulating layer of the second connection structure has a substantially uniform thickness.

11. A semiconductor package comprising:

a frame having a cavity and including a wiring structure connecting first and second surfaces of the frame to each other and including a plurality of wiring patterns, the first and second surfaces opposing each other;

a first connection structure disposed on the second surface of the frame and including a first redistribution layer connected to the wiring structure;

a semiconductor chip disposed on the first connection structure within the cavity and having connection pads connected to the first redistribution layer;

an encapsulant encapsulating the semiconductor chip, extending to cover the first surface of the frame, and having an upper surface substantially coplanar with an upper surface of the wiring structure; and a second connection structure including an insulating layer disposed on the upper surfaces of the encapsulant and the wiring structure, a second redistribution layer disposed on the insulating layer, and vias penetrating through the insulating layer and connecting the wiring structure and the second redistribution layer to each other, and wherein one of the plurality of wiring patterns protrudes from the first surface of the frame and is connected to the second redistribution layer, and wherein an extending portion of the encapsulant has a thickness substantially the same as that of the one of plurality of wiring patterns.

12. A semiconductor package comprising:

a frame having a cavity and including a wiring structure connecting first and second surfaces of the frame to each other, the first and second surface opposing each other;

a first connection structure disposed on the second surface of the frame and including a first redistribution layer connected to the wiring structure;

a semiconductor chip disposed on the first connection structure within the cavity and having connection pads connected to the first redistribution layer;

an encapsulant encapsulating the semiconductor chip, covering the first surface of the frame, and formed of a non-photoimagable dielectric (non-PID); and a second connection structure including an insulating layer disposed on upper surfaces of the encapsulant and the wiring structure and formed of a photoimagable dielectric (PID), a second redistribution layer disposed on the insulating layer, and vias penetrating through the insulating layer and connecting the wiring structure and the second redistribution layer to each other, wherein the encapsulant has the upper surface substantially coplanar with the upper surface of the wiring structure, and wherein the wiring structure includes a plurality of wiring patterns that are spaced apart from each other in a vertical direction.

13. The semiconductor package of claim 12, wherein the wiring structure has a structure protruding from the first surface of the frame.

14. The semiconductor package of claim 13, wherein one of the plurality of wiring patterns protrudes from the first surface of the frame and is connected to the second redistribution layer.

15. The semiconductor package of claim 14, wherein an extending portion of the encapsulant has a thickness substantially the same as that of the one of plurality of wiring patterns.

16. The semiconductor package of claim 12, wherein the insulating layer of the second connection structure has a substantially uniform thickness.

* * * * *